US007622851B2

(12) United States Patent
Zhang et al.

(10) Patent No.: US 7,622,851 B2
(45) Date of Patent: Nov. 24, 2009

(54) HIGH TEMPERATURE PIEZOELECTRIC MATERIAL

(75) Inventors: Shujun Zhang, State College, PA (US); Thomas R. Shrout, Pennsylvania Furnace, PA (US)

(73) Assignee: The Penn State Research Foundation, University, Park, PA (US)

( * ) Notice: Subject to any disclaimer, the term of this patent is extended or adjusted under 35 U.S.C. 154(b) by 550 days.

(21) Appl. No.: 11/333,753

(22) Filed: Jan. 17, 2006

(65) Prior Publication Data

US 2007/0164630 A1 Jul. 19, 2007

(51) Int. Cl.
*H01L 41/08* (2006.01)
(52) U.S. Cl. ...................................... 310/358
(58) Field of Classification Search ................. 310/358, 310/311, 328, 323.11; 501/152, 134; 252/62.9 R; H01L 41/09, 41/08
See application file for complete search history.

(56) References Cited

U.S. PATENT DOCUMENTS

| 5,804,907 | A | 9/1998 | Park et al. |
|---|---|---|---|
| 5,998,910 | A | 12/1999 | Park et al. |
| 6,034,015 | A | 3/2000 | Lin et al. |
| 6,083,319 | A | 7/2000 | Aka et al. |
| 6,183,578 | B1 | 2/2001 | Ritter et al. |
| 6,327,282 | B2 | 12/2001 | Hammons et al. |
| 6,370,955 | B1 | 4/2002 | Tuller et al. |
| 6,424,081 | B1 | 7/2002 | Chai et al. |
| 6,482,527 | B1 | 11/2002 | Shrout et al. |
| 6,514,336 | B1 | 2/2003 | Zavartsev et al. |
| 6,551,528 | B1 | 4/2003 | Sasaki et al. |
| 6,610,241 | B2 | 8/2003 | Shrout et al. |
| 6,625,186 | B1 | 9/2003 | Wang et al. |
| 6,679,845 | B2 | 1/2004 | Ritter et al. |
| 6,680,269 | B2 | 1/2004 | Sogabe et al. |
| 6,685,849 | B2 | 2/2004 | Eitel et al. |
| 6,859,467 | B2 | 2/2005 | Adams et al. |
| 6,964,718 | B2 | 11/2005 | Randall et al. |
| 7,029,528 | B2 * | 4/2006 | Koinuma et al. ............ 423/277 |
| 2002/0181514 | A1 | 12/2002 | Adams et al. |

OTHER PUBLICATIONS

Mougl (structural and thermal stability of Czochralski grown GDCOB p. 1619-1623, 1998).*
Hiroyuki (.Evaluation of Material constant and Temperature Properties in Lanthanum Calcium Oxoborate LaCa4O (BO3)3) Jun. 2004).*
S. Zhang, Z. Cheng, J. Lu, G. Li, J. Lu, Z. Shao, H. Chen. "Studies on the effective nonlinear coefficient of GdCa4O(BO3)3 crystal". Journal of Crystal Growth 205 (1999) 453-456.
Z. Shujun, Y. Hua, C. Zhenxiang, L. Xuesong, C. Huanchu. "Crystal growth, thermal and optical properties of SmCa4O(BO3)3 crystal". Journal of Crystal Growth 208 (2000) 482-486.
J. Stade, L. Bohaty, M. Hengst, R.B. Heimann. "Electro-optic, Piezoelectric and Dielectric Properties of Langasite (La3Ga5SiO14), Langanite (La3Ga5.5Nb0.5O14) and Langataite (La3Ga5.5Ta0:5O14)". Cryst. Res. Technology 37, 1113-1120 (2002).
S. Zhang, Z. Cheng, J. Han, G. Zhou, Z. Shao, C. Wang, Y.T. Chow, H. Chen. "Growth investigation of efficient self-frequency-doubling NdxGd1-xCa4O(BO3)3 crystal". Journal of Crystal Growth 206 (1999) 197-202.

(Continued)

*Primary Examiner*—Thomas M Dougherty
*Assistant Examiner*—Karen B Addison
(74) *Attorney, Agent, or Firm*—Gifford, Krass, Sprinkle, Anderson & Citkowski, P.C.; Douglas L. Wathen

(57) ABSTRACT

Piezoelectric devices with excellent high temperature operation capabilities are described, including piezoelectric sensors and actuators that use a rare earth calcium oxyborate or langanite as the piezoelectric material.

14 Claims, 4 Drawing Sheets

OTHER PUBLICATIONS

Shimizu et al., "Evaluation of Material Constants and Temperature Properties in Lanthanum Calcium Oxoborate LaCe4O(BO3)3 Single Crystals," Japanese Journal of Applied Physics, vol. 43, No. 9B, 2004, pp. 6716-6720 (abstract).

Mougel et al., "Structural and thermal stability of Czochralski grown GDCOB oxoborate single crystals," Journal of Material Chemistry, 1988, 8(7), 1619-1623.

* cited by examiner

HIGH TEMPERATURE PIEZOELECTRIC MATERIAL

FIELD OF THE INVENTION

The invention relates to piezoelectric materials and devices, in particular to piezoelectric devices having high temperature operation.

BACKGROUND OF THE INVENTION

A piezoelectric material generates electrical charge in response to a stress, which is termed the piezoelectric effect. The electrical charge produced is generally proportional to the applied force, changes sign between tensional or compressional stress, and determined by the piezoelectric coefficient. A larger piezoelectric coefficient is usually desirable in order to obtain a larger electric signal.

Piezoelectric sensors provide an electrical response to pressure, and act as pressure transducers. Piezoelectric sensors include acoustic sensors (such as noise, vibration, sound and ultrasound sensors), along with sonar devices, imaging devices, and the like. Pressure signals may be transmitted through a fluid from a monitored medium to a piezoelectric element of a sensor.

Piezoelectric crystals also exhibit dimension changes in response to electrical potentials, the inverse piezoelectric effect. Hence, piezoelectric devices include piezoelectric sensors, using the piezoelectric effect, and actuators that use the inverse piezoelectric effect.

If a piezoelectric material within a sensor has a low electrical resistivity, the generated charge rapidly drains away and electronic detection of the charge is therefore compromised. This is a problem for low frequency or static measurements. Hence, a high electrical resistivity is desirable. The length of time the charge is maintained is proportional to an RC time constant of the piezoelectric element (typically a piezoelectric material sandwiched between first and second electrodes). The minimum useful frequency of a piezoelectric sensor, the lower limiting frequency $f_{LL}$, is inversely proportional to the time constant. Below $f_{LL}$, the electrical charge drains away before it can be efficiently detected. Using improved materials with a low $f_{LL}$, the sensor dynamic bandwidth can be extended into audio frequencies. Therefore, a large time constant is desirable for many applications.

Piezoelectric sensors include static sensors, and acoustic sensors that are used to monitor sound waves, vibration, and noise signals. Piezoelectric sensors have been used at normal ambient temperatures, and commonly include the piezoelectric material lithium niobate, ($LiNbO_3$). However, single crystal lithium niobate has a limited operating temperature of 650° C. because of the low resistivity, restricting uses of such sensors (T. R. Shrout et al. *Piezoelectric Materials in Devices*, Ed. N. Setter, Ceramics Laboratory, EPFL, 2002, p. 413). Another commonly used piezoelectric material is the mineral tourmaline. However, this is relatively expensive, cannot easily be synthesized, and the piezoelectric coefficient is relatively low. Hence, there is a need for high temperature piezoelectric materials for improved piezoelectric sensors that can operate at temperatures above 650° C.

SUMMARY OF THE INVENTION

An improved piezoelectric device has a maximum operational temperature of at least 800° C., and includes a piezoelectric material that is a rare earth calcium oxyborate or langanite. The piezoelectric device may be a piezoelectric sensor and/or a piezoelectric actuator. Rare earth calcium oxyborates include materials of the form $ReCa_4O(BO_3)_3$, where Re represents one or more rare earth metals, such as materials of the composition $Re'_{1-x}Re''_xCa_4O(BO_3)_3$ where Re' and Re" are different rare earth metals and $0 \leq x < 1$. Rare earth metals include Gd, Y, La, Nd, Sm, Eu, Dy, Ho, Er, Tm, and Yb. Rare earth calcium oxyborates also include materials in which calcium is partially substituted with strontium and/or barium.

The term "langanite" refers to lanthanum gallium niobium oxides such as $La_3Nb_{0.5}Ga_{5.5}O_{14}$. The term langanite also includes oxides having additional substituent elements such as aluminum. An example langanite is lanthanum niobium gallium aluminum oxide (LNGA, an aluminum substituted langanite), for example $La_3Nb_{0.5}Ga_{5.5-x}Al_xO_{14}$, where $0.5 > x \geq 0$, e.g. $x \approx 0.2$.

Example piezoelectric devices include gadolinium calcium oxyborate (GdCOB), including compounds in which gadolinium may be partially substituted with one or more other rare earth metals, and yttrium calcium oxyborate, including compounds in which yttrium may be partially substituted with other one or more other rare earth metals. The piezoelectric coefficient of a rare earth calcium oxyborate $(ReCa_4O(BO_3)_3)$ piezoelectric material can be significantly enhanced using (zyw)-θ cut crystals, with a cut angle θ of between approximately 30 degrees and approximately 60 degrees. For example, the cut angle may be approximately 45 degrees for gadolinium calcium oxyborate, and approximately 30 degrees for yttrium calcium oxyborate.

An improved piezoelectric device includes a piezoelectric material having a time constant $\tau = \in_o K \rho$, where K is the relative permittivity, ρ is the resistivity, and $\in_o$ is the permittivity of free space, the time constant being equal to greater than approximately 3700 microseconds at 600° C., and/or equal to greater than approximately 100 microseconds at 800° C. Such a device can be made using a rare earth calcium oxyborate as the piezoelectric material.

DETAILED DESCRIPTION OF THE INVENTION

The transition temperature of a piezoelectric material puts a maximum on the operating temperature of a piezoelectric device, such as a piezoelectric sensor, using that material. For the lithium niobate, the limited operating temperature is 650° C. However, applications exist in which a much higher operating temperature is required. The piezoelectric coefficient increases as temperature increases, and falls at or below the crystal phase transition temperature. Hence, preferably the phase transition temperature is somewhat greater, such as 100° C. greater, than the desired maximum operating temperature.

Rare earth calcium oxyborates include materials of the general formula $ReCa_4O(BO_3)_3$ where Re represents one or more rare earth metals, including materials such as $Re'_{1-x}Re''_xCa_4O(BO_3)_3$ where Re' and Re" are first and second rare earth metals, and $0 \leq x<1$. Rare earth metals (Group 3 of the periodic table) include yttrium (Y), lutetium (Lu), and lanthanides such as La, Ce, Pr, Nd, Pm, Sm, Eu, Gd, Tb, Dy, Ho, Er, Tm, and Yb. Further, calcium may be partially substituted with strontium and/or barium, for example in materials of the type $ReCa_{4-x}M_xO (BO_3)_3$, where M represents Sr and/or Ba, and Re represents one or more rare earth metals.

As representatives of these materials, gadolinium calcium oxyborate (GdCOB, $GdCa_4O(BO_3)_3$) and yttrium calcium oxyborate (YCOB, $YCa_4O(BO_3)_3$) were studied, and shown to be extremely well suited for application in piezoelectric sensors, particularly at high temperatures.

Single crystals of rare earth calcium oxyborates are readily grown using CZ (Czochralski method) crystal growth. CZ crystal growth of GdCOB is discussed in more detail in Zhang et al., *J. Crystal Growth*, 205, 453 (1999). Other papers include Zhang et al., *J. Crystal Growth*, 206, 197 (1999) which describes CZ growth of neodymium doped gadolinium calcium oxyborate $Nd_xGd_{1-x}Ca_4(BO_3)_3$ (Nd-doped GdCOB, or $Nd_xGd_{1-x}COB$), and Zhang et al., *J. Crystal Growth*, 208, 482 (2000), which describes CZ growth of samarium calcium oxyborate $SmCa_4(BO_3)_3$, SmCOB.

Figure 1:
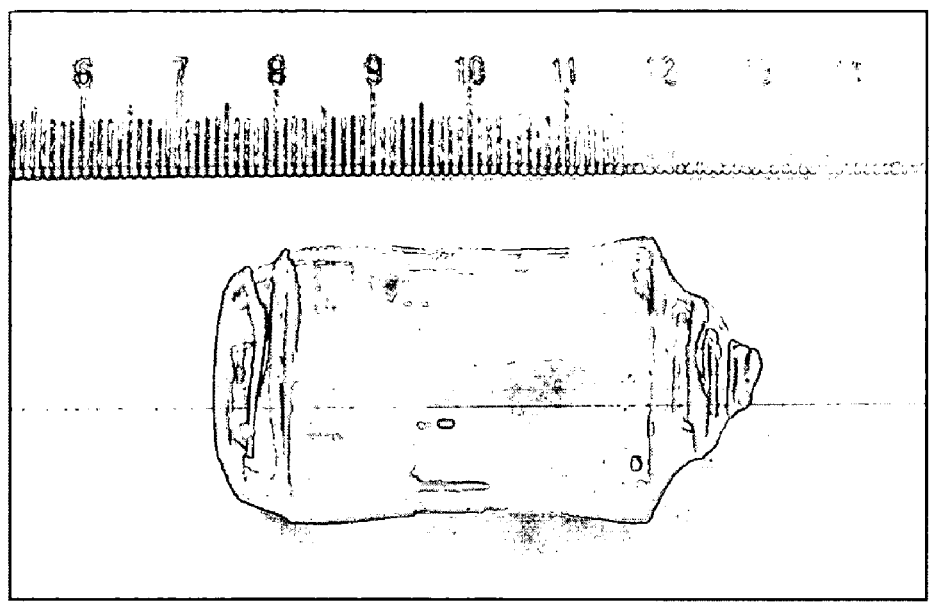
FIG. 1 shows an as-grown single crystal of gadolinium calcium oxyborate (GdCOB)

FIG. 1 shows a single crystal of GdCOB grown by the CZ method. The ferroelectric phase transitions for GdCOB and YCOB crystals were not observed until their melting temperature, between 1400 and 1550° C.

Figure 2:
FIG. 2 shows an as-grown single crystal of aluminum substituted langanite ($La_3Nb_{0.5}Ga_{5.3}Al_{0.2}O_{14}$)

FIG. 2 shows a single crystal of aluminum modified langanite. Langasite (LGS) has the composition $La_3Ga_5SiO_{14}$. The term langanite includes lanthanum gallium niobium oxide (LGN), for example $La_3Nb_{0.5}Ga_{5.5}O_{14}$, and related oxides having additional elements, such as lanthanum gallium niobium aluminum oxide (LGNA), for example $La_3Nb_{0.5}Ga_{5.5-x}Al_xO_{14}$. The composition of the crystal shown in FIG. 2 is $La_3Nb_{0.5}Ga_{5.3}Al_{0.2}O_{14}$ (private communication: Akira Yoshikawa and Tsuguo Fukuda, Institute for Materials Research, Tohoku University, Sendai 980-8577, Japan), and was originally of interest for its optical properties. However, this langanite is well suited for high temperature piezoelectric sensor applications, and is readily grown using CZ crystal growth. LNGA has a 32 point group, and the piezoelectric coefficient ($d_{33}$) measured using the Berlincourt method was found to be 7 pC/N. The langanite data discussed below were obtained from this material.

Figure 3A:
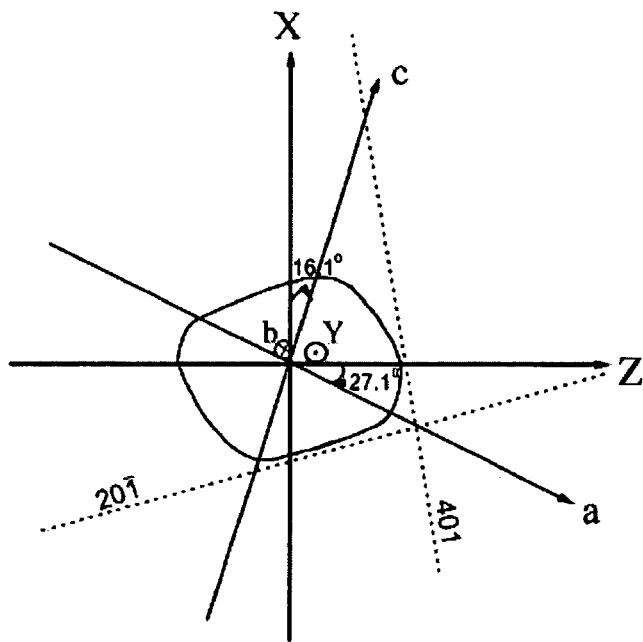
FIGS. 3A and 3B shows the orientation of the crystallophysical axes X, Y, Z, and crystallographic axes a, b, and c for GdCOB single crystals.
Figure 3B:
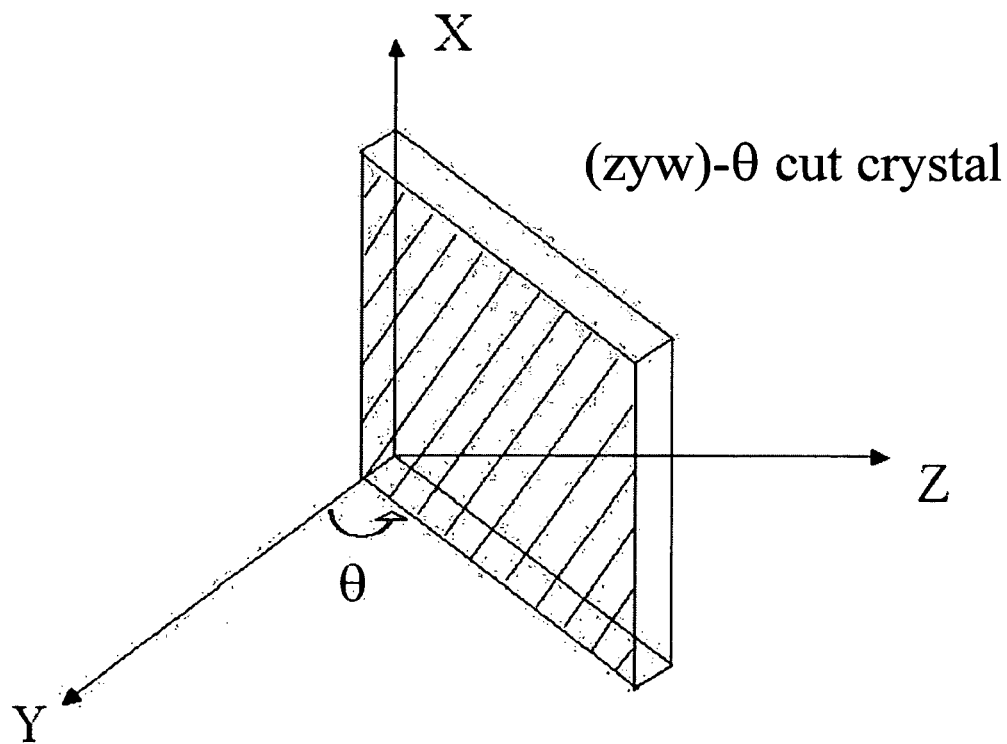

For x-cut and z-cut GdCOB crystals, the measured $d_{33}$ values were found to be around 1 pC/N. However, the oxyborate crystals have the m point group symmetry, and the value of $d_{33}$ was enhanced by cutting the crystals differently. FIGS. 3A and 3B illustrate oxyborate single crystal orientations, showing the orientation of the crystallo-physical axes X, Y, Z, and crystallographic axes a, b, and c of single crystal oxyborate crystals. Accordingly, we can obtain x, z, (zyw)-30°, (zyw)-45°, and (zyw)-60° cut crystals. In FIG. 3A, the numerical values of angles represent the relationship of crystallographic axes a, b and c with the physicallographic axes X, Y and Z (for GdCOB), the c axis being rotated 16.1° away from X axis. An enhanced value of piezoelectric coefficient ($d_{33}$) of 7 pC/N was found for an (zyw)-θ (θ=45°) cut sample of GdCOB.

Hence, the piezoelectric coefficient of rare earth calcium oxyborates can be enhanced using an (zyw)-θ cut crystal, where θ is approximately 45° for GdCOB and 30° for YCOB crystals (for example, with cut angles within ±5° of these values). For a rare earth calcium oxyborate, the (zyw)-θ cut single crystal cut angle θ is preferably between approximately 30° and approximately 60°.

Figure 4A:
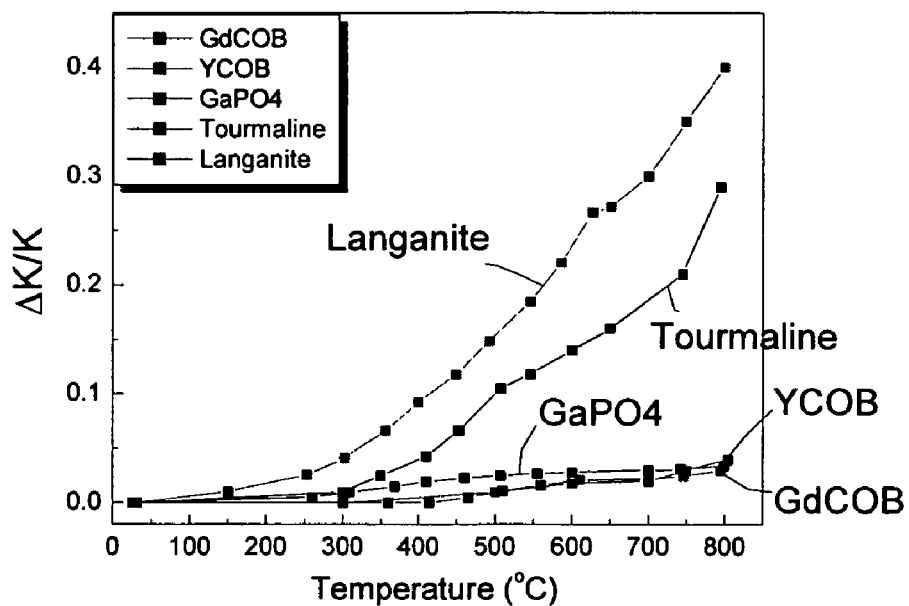
FIGS. 4A and 4B illustrate the dielectric behavior of oxyborates, langanite (LNGA), gallium phosphate, and tourmaline crystals.

FIG. 4A shows the dielectric permittivity of YCOB, GdCOB, and LNGA, compared with the gallium phosphate and tourmaline crystals. The graph shows relative changes ΔK/K, where K is the permittivity at room temperature and ΔK is the change in value). For the YCOB, GdCOB, and gallium phosphate crystals, the permittivity values were substantially constant (ΔK/K<0.05) up to 800° C. A substantially temperature independent permittivity is very useful for reducing temperature effects on the performance of a piezoelectric device. The permittivity of LNGA and tourmaline crystals was within 40% at 800° C.

Figure 4B:
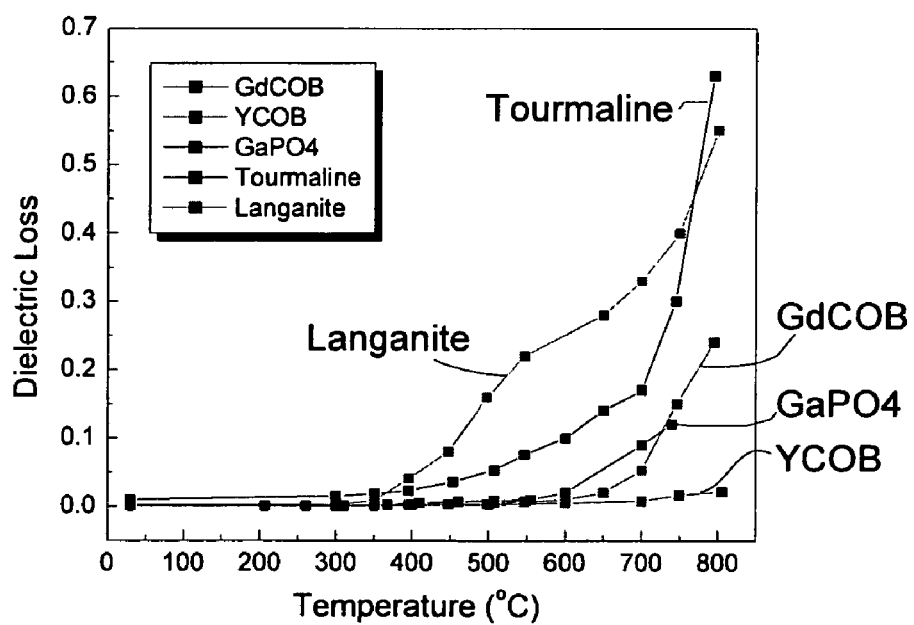

FIG. 4B shows the dielectric loss of the same materials as FIG. 4A, and similar tendencies were found. The dielectric loss values of the oxyborates were substantially zero (less than 0.05) up to at least 600° C., and the dielectric loss of YCOB was substantially zero up to 800° C. The dielectric loss of GdCOB is slightly greater than that of YCOB, but was close to that of gallium phosphate. The higher values correspond to langanite (LNGA) and tourmaline.

Figure 5:
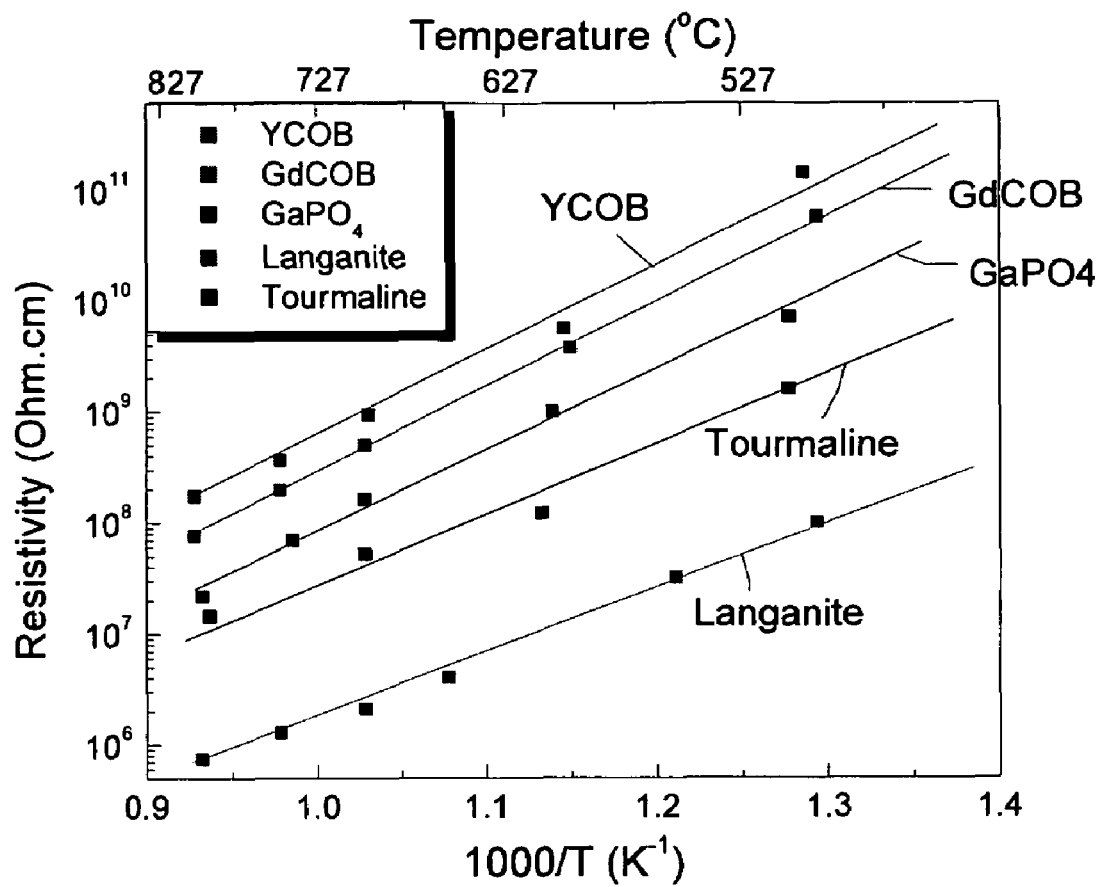
FIG. 5 shows temperature-dependent resistivity for the single crystals.

FIG. 5 shows resistivity in ohm.cm as a function of 1/T (reciprocal absolute temperature). The data show that the oxyborate single crystals YCOB and GdCOB have the highest resistivity, exceeding that of gallium phosphate over the whole temperature range, the resisitivity of both oxyborate materials exceeding $10^9$ ohm.cm at 600° C. This aspect is particularly valuable at higher temperatures, where resistivity and RC time constants are generally lower.

Table 1, below, compares various properties, including piezoelectric coefficient $d_{33}$, permittivity K, $g_{33}$ (relating to electric field strength generation), resistivity ρ, dielectric loss (tan δ), and time constant for various high temperature piezoelectric single crystals. In the crystal growth column, CZ is the relatively inexpensive Czochralski method, HT is hydrothermal, and tourmaline was a naturally occurring mineral.

TABLE 1

Properties of Piezoelectric Crystals

| Material | Growth method | Growth cost | $d_{33}$(RT) (pC/N) | K (RT) 10 kHz | $g_{33}$(RT) ×10$^{-3}$ Vm/N | ρ Ohm. cm | K 10 kHz | tan δ 10 kHz | RC (s) |
|---|---|---|---|---|---|---|---|---|---|
| | | | Room Temperature (RT) | | | Measured at 600° C. | | | |
| Tourmaline | Mineral | High | <2 | 6 | 37 | $1.4 \times 10^8$ | 6.4 | 0.023 | $8 \times 10^{-5}$ |
| LNGA | CZ | Low | 7 | 20 | 40 | $1.4 \times 10^7$ | 26 | 0.85 | $3.2 \times 10^{-5}$ |
| GaPO$_4$ | HT | High | 4–5 | 6 | 85 | $1.0 \times 10^9$ | 6.24 | 0.1 | $5.5 \times 10^{-4}$ |
| GdCOB | CZ | Low | 6–7 | 9.5 | 77 | $3.6 \times 10^9$ | 11.6 | 0.03 | $37 \times 10^{-4}$ |
| YCOB | CZ | Low | 4–5 | 11.5 | 40 | $5.7 \times 10^9$ | 12.2 | 0.01 | $61 \times 10^{-4}$ |

The time constant RC for the piezoelectric material can be calculated from the values of resistivity and dielectric permittivity. The time constant τ of a material is calculated from the permittivity K, the relative resistivity ρ (in ohm.m), and the permittivity of free space $\epsilon_o$ ($8.854 \times 10^{-12}$) using the equation: $\tau = \epsilon_o K \rho$. The time constant is often referred to as the RC time constant, as it predicts the RC time constant of a capacitive element (such as a sensor element) including the piezoelectric material, where R is the resistance through the material and C is capacitance. A low value of R leads to rapid discharge of any generated charge.

Table 2, below, shows the time constants in microseconds at 600° C. and 800° C. for the high temperature piezoelectric single crystals. A larger time constant facilitate the use of the materials in sensor applications. These data show that the oxyborates have excellent performance at high temperature when compared to the conventional materials, gallium phosphate and tourmaline.

TABLE 2

RC Time Constants In Microseconds (μs)

| | Tourmaline | GaPO$_4$ | LGS | LNGA | GdCOB | YCOB |
|---|---|---|---|---|---|---|
| 600° C. | 80 | 550 | 3 | 32 | 3700 | 6100 |
| 800° C. | 10 | 11 | 0.11 | 2 | 100 | 200 |

As shown above in Table 1 and Table 2, the oxyborate single crystals YCOB and GdCOB possess the following advantages: low cost as the CZ method can be used for the crystal growth; a high temperature usage range at least up to 800° C.; high resistivity and large RC time constants; high piezoelectric coefficient; low dielectric loss; and a dielectric permittivity that is largely temperature independent. LNGA shares many of these advantages, also being grown by the CZ method, having a high value of piezoelectric coefficient, and a high temperature usage range.

In piezoelectric actuators, an electrical potential is converted to movement of a crystal surface or a pressure provided by the surface using the inverse piezoelectric effect. The high temperature materials described herein can also be used in high temperature piezoelectric actuators. Larger values of resistivity (and RC time constant) are useful to prevent applied electrical signals from leaking away through the piezoelectric material and compromising actuator performance. Hence, the oxyborates and LNGA are also very useful for high temperature, high performance actuators. Actuators include positioning devices and the like.

Compared with ferroelectric ceramics and single crystals, the oxyborate and LNGA crystals do not have a ferroelectric phase transition until they melt, which greatly expands the operational range of applications. The high resistivity, large RC time constant, and large piezoelectric coefficient at high temperatures make these materials particularly valuable for aerospace, aircraft, and automotive industrial applications.

Single crystal piezoelectric materials were machined into single crystal rings, which can be used as the piezoelectric component of a sensor.

The invention is not restricted to the illustrative examples described above. Examples are not intended as limitations on the scope of the invention. Methods, apparatus, compositions, and the like described herein are exemplary and not intended as limitations on the scope of the invention. Changes therein and other uses will occur to those skilled in the art. The scope of the invention is defined by the scope of the claims.

Patents, patent applications, or publications mentioned in this specification are incorporated herein by reference to the same extent as if each individual document was specifically and individually indicated to be incorporated by reference.

The invention claimed is:

1. A piezoelectric device having a maximum operational temperature of at least 800° C., the piezoelectric device comprising a piezoelectric material, the piezoelectric material being a langanite,
   the langanite being an aluminum substituted lanthanum niobium gallium oxide.

2. A piezoelectric device having a maximum operational temperature of at least 800° C., the piezoelectric device comprising a piezoelectric material, the piezoelectric material being a langanite,
   wherein the langanite is an aluminum substituted langanite represented by $La_3Nb_{0.5}Ga_{5.5x}Al_xO_{14}$, wherein $0.5 > x \geq 0$.

3. The piezoelectric device of claim 2, wherein $x \approx 0.2$.

4. A piezoelectric device comprising a piezoelectric material, the piezoelectric material having a maximum operational temperature of at least 800° C.,
   wherein the piezoelectric material is a rare earth calcium oxyborate,
   wherein the piezoelectric material has a time constant $\tau = \epsilon_0 K \rho$, where K is the relative permittivity, ρ is the resistivity, and $\epsilon_0$ is the permittivity of free space, the time constant being equal to or greater than approximately 3700 microseconds at 600° C.

5. The piezoelectric device of claim 4, the time constant being approximately equal to or greater than 100 microseconds at 800° C.

6. The piezoelectric device of claim 4, wherein the piezoelectric device is a piezoelectric sensor providing an electrical signal in response to a force.

7. The piezoelectric device of claim 4, wherein the piezoelectric device is an actuator.

8. A piezoelectric device, comprising an (zyw)-θ cut single crystal of a rare earth calcium oxyborate,
   the (zyw)-θ cut single crystal having a cut angle θ between approximately 30° and approximately 60°.

9. The piezoelectric device of claim 8, wherein the rare earth calcium oxyborate is represented by the formula $ReCa_4O(BO_3)_3$ where Re represents one or more rare earth metals selected from the group consisting of Y, Lu, La, Ce, Pr, Nd, Pm, Sm, Eu, Gd, Tb, Dy, Ho, Er, Tm, and Yb.

10. The piezoelectric device of claim 8, wherein the rare earth calcium oxyborate is gadolinium calcium oxyborate, and the cut angle is approximately 45 degrees.

11. The piezoelectric device of claim 8, wherein the rare earth calcium oxyborate is yttrium calcium oxyborate, and the cut angle is approximately 30 degrees.

12. The piezoelectric device of claim 8, wherein the piezoelectric device is a piezoelectric sensor.

13. The piezoelectric device of claim 8, wherein the piezoelectric device is an actuator.

14. A piezoelectric device, comprising an (zyw)-θ cut single crystal of a rare earth calcium oxyborate,
   the (zyw)-θ cut single crystal having a cut angle θ between approximately 30° and approximately 60°,
   wherein the rare earth calcium oxyborate has a time constant $\tau = \epsilon_0 K \rho$, where K represents relative permittivity, ρ represents electrical resistivity, and $\epsilon_0$ represents permittivity of free space,
   the time constant being equal to greater than approximately 100 microseconds at 800° C.

\* \* \* \* \*

UNITED STATES PATENT AND TRADEMARK OFFICE
CERTIFICATE OF CORRECTION

| | |
|---|---|
| PATENT NO. | : 7,622,851 B2 |
| APPLICATION NO. | : 11/333753 |
| DATED | : November 24, 2009 |
| INVENTOR(S) | : Zhang et al. |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 861 days.

Signed and Sealed this

Twenty-sixth Day of October, 2010

David J. Kappos
*Director of the United States Patent and Trademark Office*